United States Patent
Hoekstra et al.

(10) Patent No.: US 6,211,488 B1
(45) Date of Patent: Apr. 3, 2001

(54) METHOD AND APPARATUS FOR SEPARATING NON-METALLIC SUBSTRATES UTILIZING A LASER INITIATED SCRIBE

(75) Inventors: Brian L Hoekstra, Melbourne; Leonid B. Glebov; Oleg M. Efimov, both of Orlando, all of FL (US)

(73) Assignee: Accudyne Display and Semiconductor Systems, Inc., Palm Bay, FL (US)

( * ) Notice: Subject to any disclaimer, the term of this patent is extended or adjusted under 35 U.S.C. 154(b) by 0 days.

(21) Appl. No.: 09/240,057

(22) Filed: Jan. 29, 1999

Related U.S. Application Data

(60) Provisional application No. 60/110,533, filed on Dec. 1, 1998.

(51) Int. Cl.$^7$ .................................................. B23K 26/36
(52) U.S. Cl. ............................ 219/121.72; 219/121.67; 219/121.76; 225/2; 225/93.5
(58) Field of Search .................... 225/1, 2, 93.5; 219/121.76, 121.67, 121.72, 121.68, 121.69

(56) References Cited

U.S. PATENT DOCUMENTS

| | | |
|---|---|---|
| 3,894,208 | 7/1975 | Bergmann . |
| 3,932,726 | 1/1976 | Verheyen et al. . |
| 3,935,419 | 1/1976 | Lambert et al. . |
| 4,092,518 | * 5/1978 | Merard ..................... 219/121.69 |
| 4,451,872 | 5/1984 | Hartwig . |
| 4,467,168 | 8/1984 | Morgan et al. . |
| 4,468,534 | 8/1984 | Boddicker . |
| 4,937,424 | 6/1990 | Yasui et al. . |
| 5,498,851 | 3/1996 | Hayashi et al. . |
| 5,630,308 | 5/1997 | Guckenberger . |
| 5,637,244 | * 6/1997 | Erokhin ..................... 219/121.69 |
| 5,728,993 | 3/1998 | O'Neill . |
| 5,844,707 | 12/1998 | Minakuchi et al. . |
| 5,871,134 | 2/1999 | Komagata et al. . |
| 5,935,464 | 8/1999 | Dulaney et al. . |
| 5,961,852 | 10/1999 | Rafla-Yuan et al. . |
| 5,968,382 | * 10/1999 | Matsumoto et al. ............ 219/121.72 |
| 6,023,039 | 2/2000 | Sawada . |
| 6,037,564 | 3/2000 | Tatah . |

FOREIGN PATENT DOCUMENTS

| | | |
|---|---|---|
| 1433563 | * 4/1976 | (GB) . |
| 8-175837 | 7/1996 | (JP) . |
| 10-116801 | 5/1998 | (JP) . |
| 20000061676 | 2/2000 | (JP) . |

* cited by examiner

Primary Examiner—Geoffrey S. Evans
(74) Attorney, Agent, or Firm—Banner & Witcoff, Ltd.

(57) ABSTRACT

An apparatus and method for physically separating non-metallic substrates forms a microcrack in the substrate and controllingly propagates the microcrack. An initial mechanical or pulsed laser scribing device forms a microcrack in the substrate. If a pulsed laser is used, it forms a crack inside the substrate that does not extend to either the upper or lower surface. A scribe beam is applied onto the substrate on a separation line. A coolant stream intersects with, or is adjacent to, the trailing edge of the scribe beam. The temperature differential between the heat affected zone of the substrate and the coolant stream propagates the microcrack. Two breaking beams on opposing sides of the separation line follow the coolant stream. The breaking beams create controlled tensile forces that extend the crack to the bottom surface of the substrate for full separation. The scribe and break beams and coolant stream are simultaneously moved relative to the substrate. A preheat beam preheats the heat affected area on the substrate. The beams are formed by an arrangement of lasers and mirrors and lenses. A movable mirror selectively diverts a beam to form either the preheat beam or one or more of the break and scribe beams. Spherical aberration is introduced in the break and scribe beams to flatten their energy distribution profiles and evenly apply the beam energy.

24 Claims, 14 Drawing Sheets

METHOD AND APPARATUS FOR SEPARATING NON-METALLIC SUBSTRATES UTILIZING A LASER INITIATED SCRIBE

STATEMENT OF RELATED APPLICATIONS

This application discloses and claims subject matter that is disclosed in copending provisional patent application No. 60/110,533, entitled Method and Apparatus for Separating Non-Metallic Substrates, filed Dec. 1, 1998. This application is related to copending patent applications entiled (1) Method For Separating Non-Metallic Substrates, (2) Apparatus For Separating Non-Metallic Substrates, and (3) Method And Apparatus For Separating Non-Metallic Substrates Utilizing A Supplemental Mechanical Force Applicator, all filed on Jan. 29, 1999.

TECHNICAL FIELD OF THE INVENTION

This invention generally relates to the physical separation of a non-metallic substrate into a plurality of smaller substrate pieces. In particular, the invention relates to a method and apparatus for splitting a non-metallic substrate by the process of micro-cracking and controlled propagation.

BACKGROUND OF THE INVENTION

Many products made from a brittle non-metallic material, for example glass and semi-conductor wafer materials, are formed by separating a piece, sheet, wafer, or panel into a number of smaller pieces of the desired size or sizes. For example, many glass products are formed by a large sheet of glass separated into smaller pieces of the desired size. The most common method for cutting these sheets and other substrates includes the use of mechanical cutting tools. For example, glass sheets have been cut by scribing the glass with a diamond-tipped scribe or a carbide wheel to weaken the molecular structure. After the scribe has been made, physical pressure is applied to create a force at the scribe line to hopefully break the glass along the scribe line.

However, cutting with mechanical tools has significant disadvantages. One significant disadvantage is the inability to obtain smooth edges. his may be unacceptable for many products because of the required quality of the edge faces. Accordingly, as an attempt to rectify this drawback, secondary steps such as grinding, edge seaming, and polishing may be performed. However, such secondary steps slow down the manufacturing process and can be expensive. Another disadvantage is that edge defects on some of these rough edges may result in crack propagation during further processing or in the ultimate product. The edge strength of the substrate is also reduced by this process. Yet another disadvantage is the creation of glass particulates and "shards" during the cutting stage. These glass shards and particulate are undesirable because they can contaminate the substrate being separated, and require that additional clean-up steps be performed to minimize their impact on the manufacturing process. Mechanical tools also create wide scribe lines which are undesirable because the process reduces the useful area of the substrate from which the parts are cut. Further, mechanical tools are subject to wear, and worn tools result in inconsistent and unreliable cuts.

One alternative to mechanical division of pieces of non-metallic brittle substrates is using a laser to melt the substrate along a predetermined line. European Patent Application No. 82301675.3 discloses one such method. According to this method, a sheet of glass is mounted to a plate. A high-powered laser beam is applied to cause rapid localized heating of the glass in a small heat affected zone that extends through the entire thickness of the glass. This heats the glass above its annealing temperature so that part of the glass is vaporized and part of the glass becomes viscous. A pressurized air jet removes the molten glass from the heat affected zone to divide the glass substrate. However, this process also suffers from drawbacks.

A drawback of this process is that predictable and highly accurate cuts are unobtainable because the glass is subjected to extreme temperatures and is removed from the cutting line. This lack of precision is magnified with thicker pieces of glass. Additionally, secondary steps such as grinding, edge seaming, and polishing may also need to be performed to achieve desired edge face quality.

Another alternative to mechanical cutting of pieces of non-metallic brittle materials has been the process of creating a localized fracture through a substrate, and propagating the localized fracture to part the substrate. On such method is disclosed in U.S. Pat. No. 3,629,545 to Graham et al. According to this process, light from a laser is focused by a lens system upon the upper surface of the substrate at an extreme edge of the substrate. The lens system is adjusted so that the focal point of the laser beam image falls precisely at the upper surface of the substrate. The concentrated laser energy creates a localized fracture in the substrate. The substrate is moved relative to the beam. This relative movement propagates the initial localized fracture along a desired partition path. There have been many variations to this process.

The processes of creating a localized fracture and propagating the fracture have also suffered drawbacks. One drawback is that these processes include inefficiencies rendering them impractical and/or ineffective for many commercial applications. For example, some of these processes are limited by cutting speed. Further, some of these processes still require manual breakage of the substrate after the passage of the laser. Another drawback to these processes is the inherent limitations imparted due to the coefficient of thermal expansion of the substrate being cut.

Therefore, there exists a need for an improved method of dividing or parting substrates is of brittle non-metallic material that overcomes these and other problems.

SUMMARY OF THE INVENTION

It is an object of the present invention to overcome the drawbacks associated with current methods of microcrack initiation.

It is an object of the present invention to initiate a microcrack by using a laser in the process of separation by microcracking The present invention accomplishes this laser initiated scribe process by using a pulse laser to crack the substrate between its upper and lower surfaces. The pulsed laser can be tuned to form a desired mircocrack shape.

It is an object of the present invention to provide a method for separating a non-metallic substrate. The substrate has an upper surface and a lower surface. The method includes forming a crack in the substrate between the upper surface and the lower surface that does not extend vertically to reach either the upper surface or the lower surface. The crack is propagated for separation of the substrate.

It is another object of the present invention to provide a method for separating a non-metallic substrate. The substrate has an upper surface and a lower surface. The method includes directing a pulsed laser towards the substrate so that the focal point of the laser is between the upper and lower surface of the substrate. The laser is pulsed. An incident beam of coherent radiation is directed onto the substrate to impinge at a spot positioned at least behind the focal point of the pulsed laser. Additionally, a stream of coolant is directed onto the substrate at a location behind at least a portion of the spot caused by the incident beam.

In another object of the present invention, an apparatus is used for dividing a non-metallic substrate having an upper surface and a lower surface. The apparatus includes a pulsed laser to emit a pulsed first beam to be directed at the substrate. The apparatus also includes an incident second beam of coherent radiation positioned to impinge on the substrate at a location at least partially behind the pulsed first beam.

It is an object of the present invention to provide an apparatus for dividing a non-metallic substrate having an upper surface and a lower surface. The apparatus includes a pulsed laser, optics, a second laser, and a quenching device. The pulsed laser emits a pulsed beam. The optics direct the focal point of the emitted pulsed beam to lie between the upper and lower surfaces of the substrate at a first spot. The second laser emits an incident beam of coherent radiation positioned to impinge on the substrate at a second spot positioned at least partially behind the first spot. The quenching device projects a steam of coolant onto the substrate at a location behind the first spot and behind at least a portion of the second spot.

These and other objects and features of the invention will be apparent upon consideration of the following detailed description of preferred embodiments thereof, presented in connection with the following drawings in which like reference numerals identify like elements throughout.

DETAILED DESCRIPTION OF THE DRAWINGS

Figure 1:
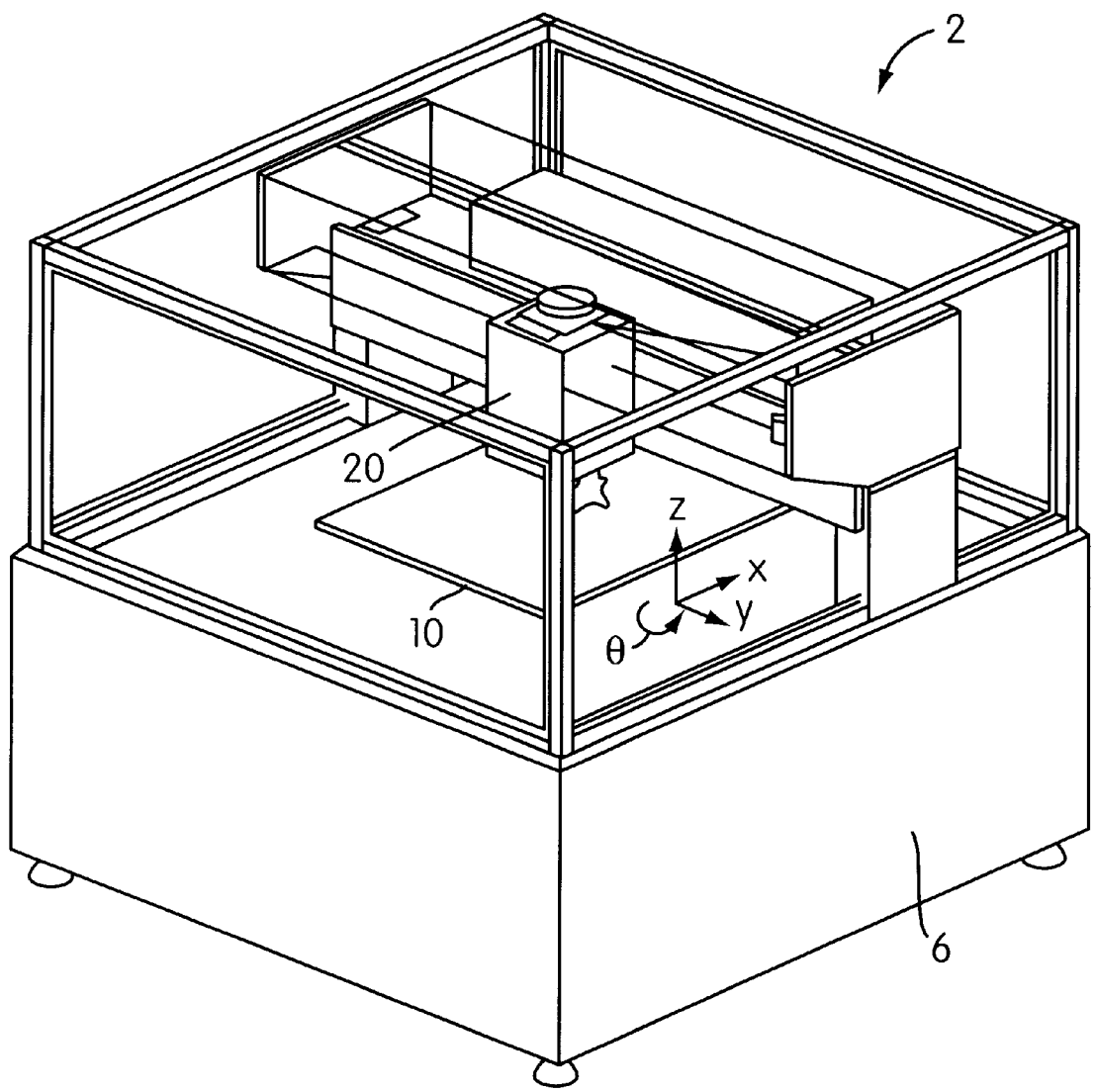
FIG. 1 is a schematic view of the system including the table and the splitting device.

The present invention provides a method and apparatus for splitting a non-metallic brittle substrate into distinct members. One preferred application for this apparatus and method is for separating glass substrates. However, this apparatus and method may be useful for dividing other types of non-metallic brittle substrates such as quartz, quartz glass, ceramics, silicon, sapphire, and various other electronic and optical materials.

As an overview, a substrate 4 is mounted on a table 10 below a splitting device 20. The substrate 4 is initially scribed, either by a mechanical device or a laser, to initiate a microcrack. At least one scribe beam is applied onto the substrate at the microcrack in the direction that the substrate will be cut. A coolant stream is located at or adjacent to the trailing end of the scribe beam. The temperature differential between the heat affected zone of the substrate and the coolant stream propagates the initiated microcrack along the substrate. Two breaking laser beams, each laterally displaced from the microcrack on opposite sides, immediately follow the coolant stream. These breaking beams create controlled tensile forces sufficient to extend the crack to the bottom surface of the substrate, thereby dividing the substrate along the path of the microcrack. This defects full body separation. A mechanical force may be used to facilitate the splitting along the microcrack.

The system for spliting brittle non-metallic substrates is represented by reference numeral 2. The system 2 includes a frame 6, a splitting device 20 and a substrate holding table 10 located below the splitting device 20. Relative motion between the splitting device 20 and the substrate holding table 10 is provided by one or more conventional linear and/or rotary drives. This relative motion can be accomplished by moving the table holding the substrate, by moving the laser and quenching device, or by moving optics and the quenching device. For example, this relative motion can be accomplished by using drives 12, 14, 16 to move the table 10 in the X, Y, and Θ directions. If desired, movement in the X and Y directions can be accomplished by a conventional known gantry-type device. This enables a substrate on the table 10 to move in any direction within a horizontal plane. AZ-direction drive 22 may be provided to move the splitting device 20 in the Z direction so that substrate may be easily loaded and unloaded on the table 10.

The splitting device 20 includes a scribe initiation device 24, a beam producing and quenching device 26, and may include a mechanical force applicator 28. The beam producing and quench device 26 propagates a crack in the substrate. If the substrate 4 has been cut by a mechanical tool, it will likely inherently include many edge imperfections which can be propagated. However, if the substrate 4 has a laser-cut edge, there are basically no flaws to propagate. In these instances, the scribe initiation device 24 is used. The scribe initiation device 24 forms a small crack or "microcrack" in the substrate 4 along the beginning of separation line 45. A separation line is an imaginary line where the substrate is intended to be split. If the substrate is supplied with scores or inherent microcracks, the scribe initiation device 24 may be turned off or not included.

SCRIBE INITIATION DEVICE

The scribe initiation device 24 can either be a mechanical device or a pulsed laser. One desirable mechanical device that may be used for making the desired scores is a hardened steel carbide wheel 30 which is mounted for rotation about an axis perpendicular to the direction of the cut to be formed. Hardened steel wheels are commercially available and have been used for mechanically cutting glass. If desired the steel may be impregnated or coated with diamond flakes to increase the life of the wheel 30.

The wheel 30 is coupled to a Z-drive 32 for moving the wheel 24 vertically with respect to the substrate 4 so the wheel 30 can be moved into engagement with the front boundary layer of the substrate 4. The Z-drive may include an electromagnetic, hydraulic, or pneumatic actuator. Very litlle pressure is required to initiate a microcrack. Preferably, the wheel 30 is actuated only for a small distance, for example, 0.5–1.5 cm., from the front edge of the substrate 4. The wheel 24 is also capable of initiating microcracks across fully separated boundaries. That is, the wheel 30 can form microcracks in the substrate that has already been fully separated in a direction perpendicular to the direction of the microcracks, by the controller 40 causing the Z-drive 32 to lower and raise the wheel 24 at the proper times. This process is used to form cross cuts in the substrate 4. As an desirable alternative to wheel 30, a diamond scribe tip, not shown, may be coupled to a Z-drive 32 and used for forming an initial microcrack in the upper boundary layer of the substrate 4.

Figure 4:
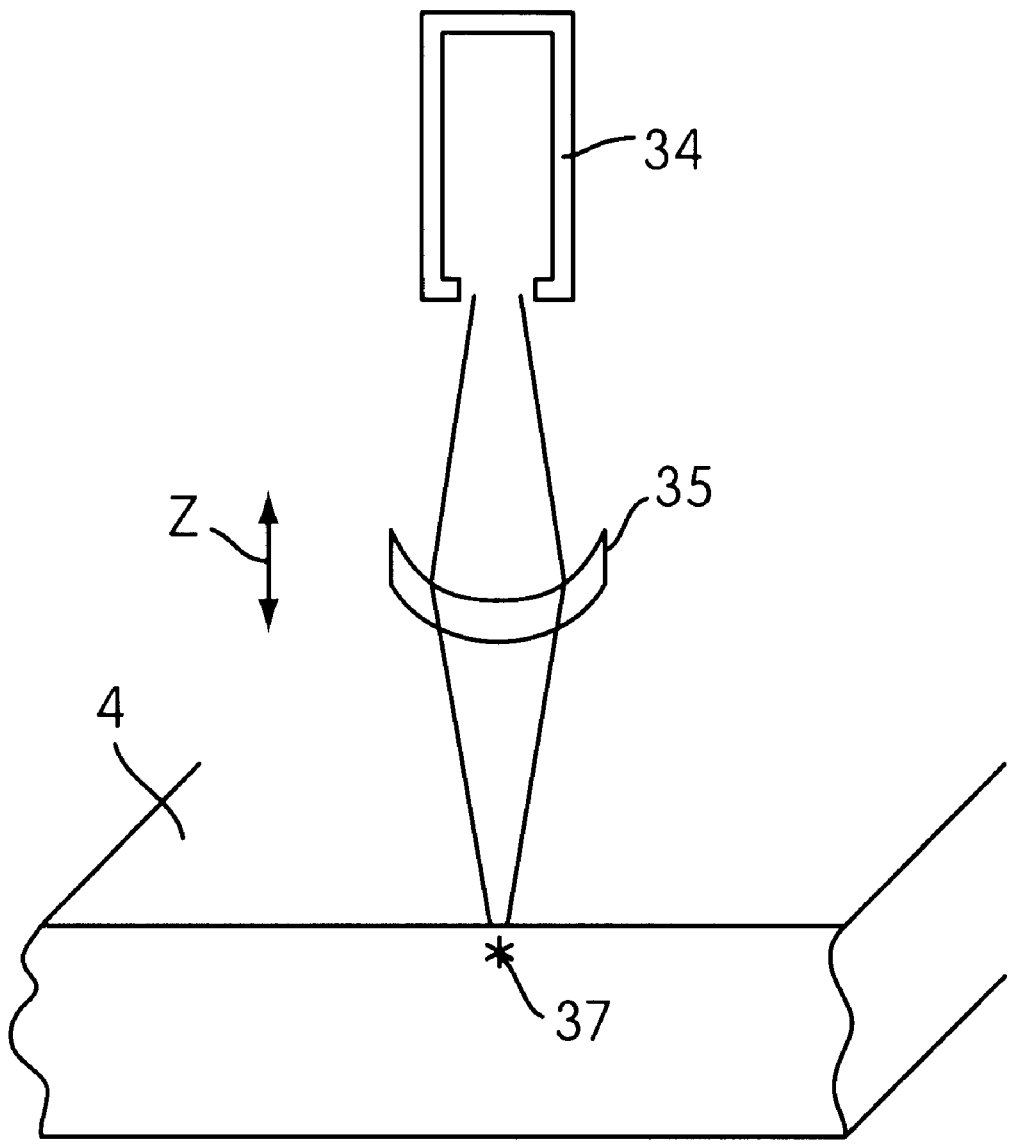
FIG. 4 is a schematic end view of a laser scribe initiation device.

An alternative to mechanical scribe initiation, a laser scribe initiation device as shown in FIG. 4. may be used to initiate laser scribing. The laser scribe initiation device preferably includes a pulsed laser 34 and a lens 35. The pulsed laser 34 is what is commonly referred to as a single pulse laser, that is, it can deliver a burst of energy in a single short pulse. The lens 35 is designed to minimize spherical aberration and produce a minimum focal size of the incoming beam. In a preferred embodiment, a meniscus, planarconvex or biconvex lens 35 may be used. A power control 36 is coupled to the controller 40 and to the laser 34 so that the laser 34 can be pulsed at desired times. A Z-drive 38 permits the vertical adjustment of the lens 35 so that the focal point 37 of the laser 34 may be vertically positioned within the substrate 4 as desired. In a preferred arrangement, the focal point of the pulsed laser is within the thickness of the substrate 4, slightly below the upper face of the substrate 4. For example, for a glass sheet having a thickness of approximately 1 mm, the focal point should be 5–50% or 0.05–0.50 mm, from the upper surface, preferably about 0.1 mm. However, the preferred depth of the focal point may depend on the thickness of the subsrate to be split.

The pulsed laser 34 through the lens 35 creates a void 37 in the substrate from the edge of the substrate 4 inward at a certain distance below the upper face of the substrate 4. It accomplishes this by melting the material in that small region, and this material subsequently reforms with a different morphology as part of the remainder of the substrate 4. The pulsed laser 34 may be applied from a first edge of the substrate 4 inward a small predeterined distance. Optionally, the pulsed laser 34 may be applied from one end of the substrate 4 to the other end. If the laser 34 is only applied a predetermined distance inwardly, it is preferable to repower the laser 34 at the far end of the substrate 4 to provide a void at the far end so the microcrack will extend straight until the far edge and will not be susceptible to veering off in the direction of imperfections formed or inherent on the edge of the substrate.

The induced void 37 will typically be shaped like a microscopic starburst. However, to further increase the smoothness of the cut edges, the void 37 in the substrate may be shaped to another desired shape by "tuning" or varying the polarization, pulse width, and/or mode of the laser 34. In turn, this shape will dictate the shape of the microcrack that will be formed.

In a preferred embodiment for splitting glass, a Neodminium Yitrium-Aluminum-Garnet or "Nd:YAG" laser is desirable. If the substrate 4 is glass, it is preferably to use a wavelength of 1.06 $\mu$m and a pulse width in the range of 100 picoseconds to 40 nanoseconds, preferably 1 nanosecond. However, other laser types and parameters may be used, and other types and parameters may be preferred based on the type or thickness of substrate to be split.

The laser scribe initiation device 24 eliminates inherent drawbacks of a mechanical scribe initiation system. For example, the use of the laser scrib initiation device 24 eliminates any particulate material that may be generated by mechanically forming the microcrack. It also provides enhanced control and accuracy.

THE BEAM PRODUCING AND QUENCHING SYSTEM

Figure 3:
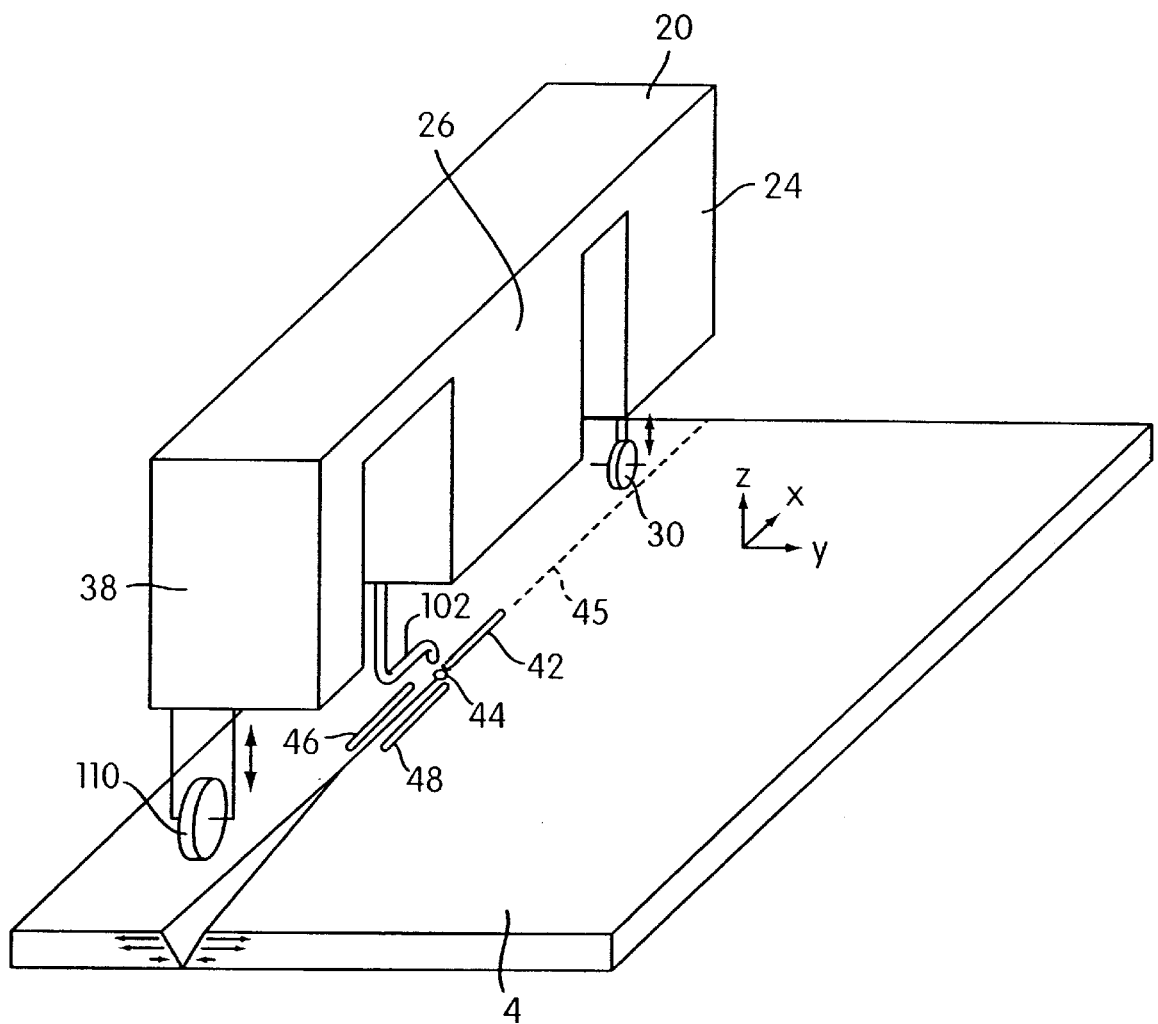
FIG. 3 is a schematic isometric view of the splitting device.
Figure 5:
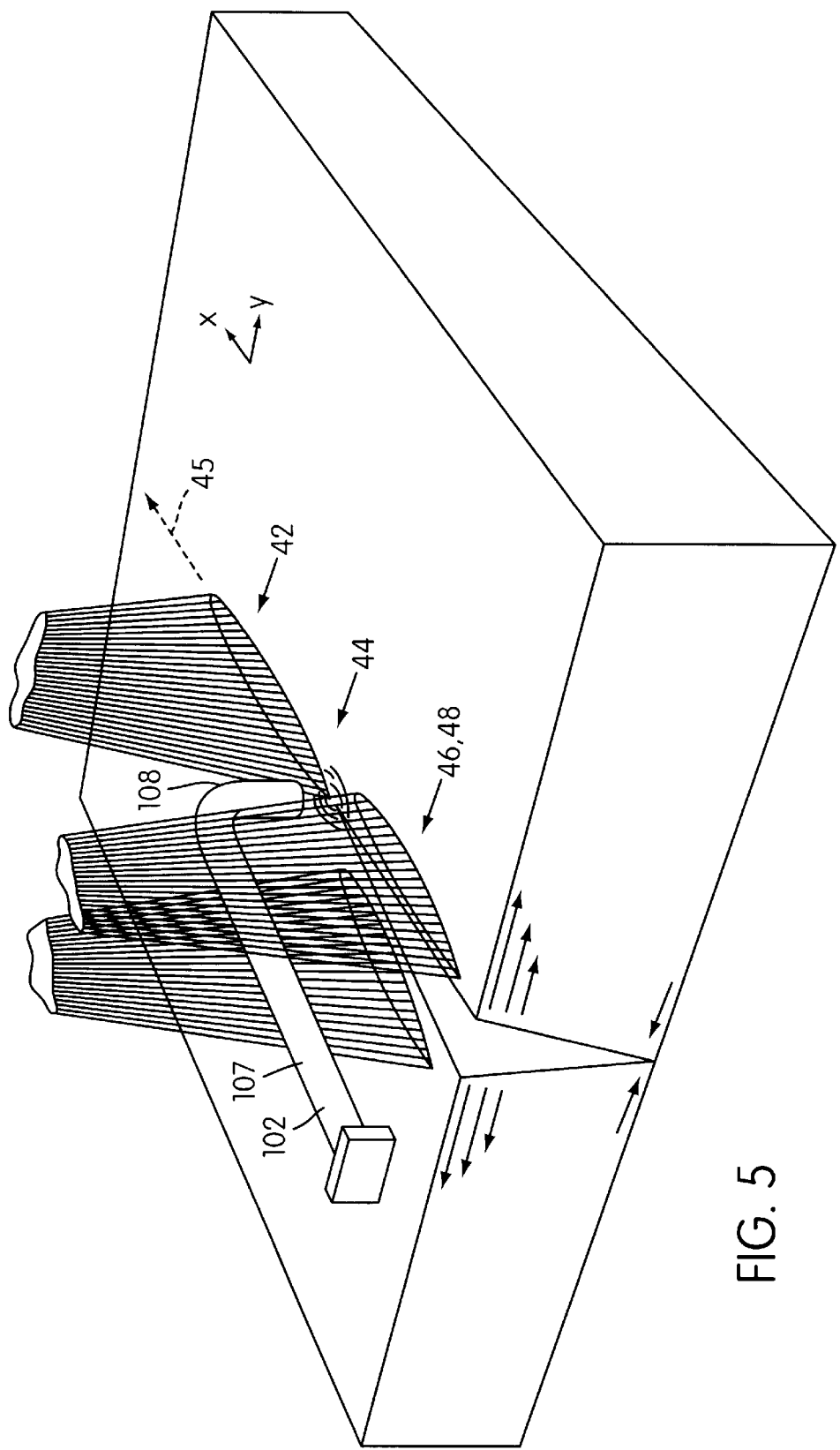
FIG. 5 is an isometric view of the relationship between the scribe and break beams, the quenching stream, and the separation line.

As shown in FIGS. 3 and 5, the beam producing and quenching device 26 produces a scribe beam 42, a quenching stream 44 of gas and/or fluid, and breaking beams 46 and 48. The splitting device 20 is moved relative to the table 10 and substrate 4 so (a) the scribe beam 42 heats the substrate 4, from the initial microcrack formed by the scribe initiation device 24, along the separation line 45, (b) the quenching stream 44 removes the heat from the substrate 4 along the separation line 45, hereby thermally shocking the substrate 4 in that region and propagating the microcrack along the separation line 45, and (c) the break beams 46 and 48 heat the regions on both sides of the microcrack to create tensile forces to that are sufficient to separate the substrate 4 along the separation line 45 from the microcrack to the bottom surface.

THE LASER AND OPTCAL SYSTEM

The laser and optical system 50 is responsible for generating and supplying the scribe beam 42 and the break beams 46 and 48. In a first arrangement as shown in FIG. 6, the laser and optical system 50 includes a laser 54, a collimator 56, a reflective mirror 58, a concave-planar lens 60, a cylinder lens 62, and a faceted lens 64.

In a preferred embodiment, laser 54, preferably a 200 watt or greater $CO_2$ laser having an approximate wavelength of 10.6 $\mu$m, is used to provide the initial beam of energy. However, it is recognized that other types of lasers such as HF, CO, coil, and Erbium YAG could be used. The laser 54 is preferably used in its stable $TEM_{00}$ mode (95%). Operating the laser 54 in such a mode produces an initial smooth curved Gaussian profile similar to that illustrated by profile 68 in FIG. 7. Power to the laser 54 can be controlled by a switch 55 which is coupled to the controller 40. If the substrate 4 is glass, it is preferred that the laser 54 emit radiation in the infra-red range.

Figure 6:
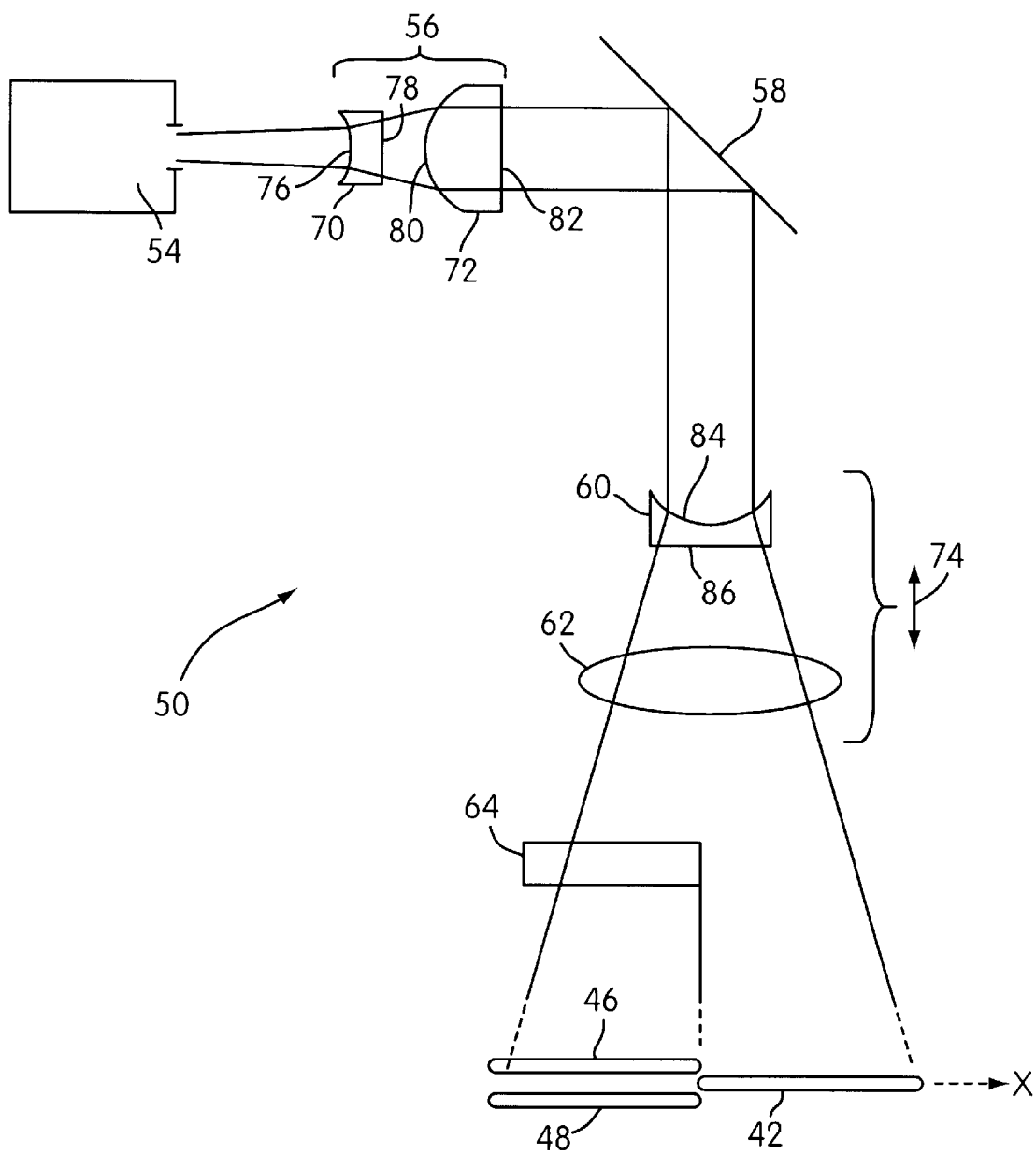
FIG. 6 is a schematic representation of the laser and optical system.

As shown in FIG. 6, the radiated beam passes through two sets of optical elements, that are preferably made from Zinc Selenide (ZnSe) or another material that transmits at the wavelength produced by the laser 54. For example, if a wavelength of 10.6 μm is used, Germanium (Ge) and Zinc Sulfide (ZnS) optical elements may also be suitable. The first set of elements is the collimator/beam expander 56. This collimator 56 includes a planar-concave negative optical element 70 followed by a planar-onvex optical element 72. In a preferred arrangement, the planar-concave optical element 70 has a −50 mm effective focal length while the planar-convex optical element 72 has a +150 mm effective focal length. The elements 70 and 72 are spaced to effectively widen the beam by a 3-to-1 ratio.

The planar-concave negative optical element 70 and the planar-convex optical element 72 of collimator 56 inherently impart some spherical aberration into a beam traveling therethrough. The amount of spherical aberration imparted into the beam is higher with the elements 70 and 72 placed in the orientation shown in FIG. 6 than would be imparted if the elements 70 and 72 were each facing the opposite diection. That is, planar-concave optical element 70 imparts more spherical aberration oriented with the incoming beam first contacting its concave surface 76 than it would if the incoming beam first contacts its planar surface 78. Additionally, planar-convex optical element 72 imparts more spherical aberration oriented with the incoming beam first contacting its convex surface 80 than it would if the incoming beam first contacted its planar surface 82. Spherical aberration is undesirable in most laser-optic applications because it defocuses the beam from its focal point.

Figure 7:
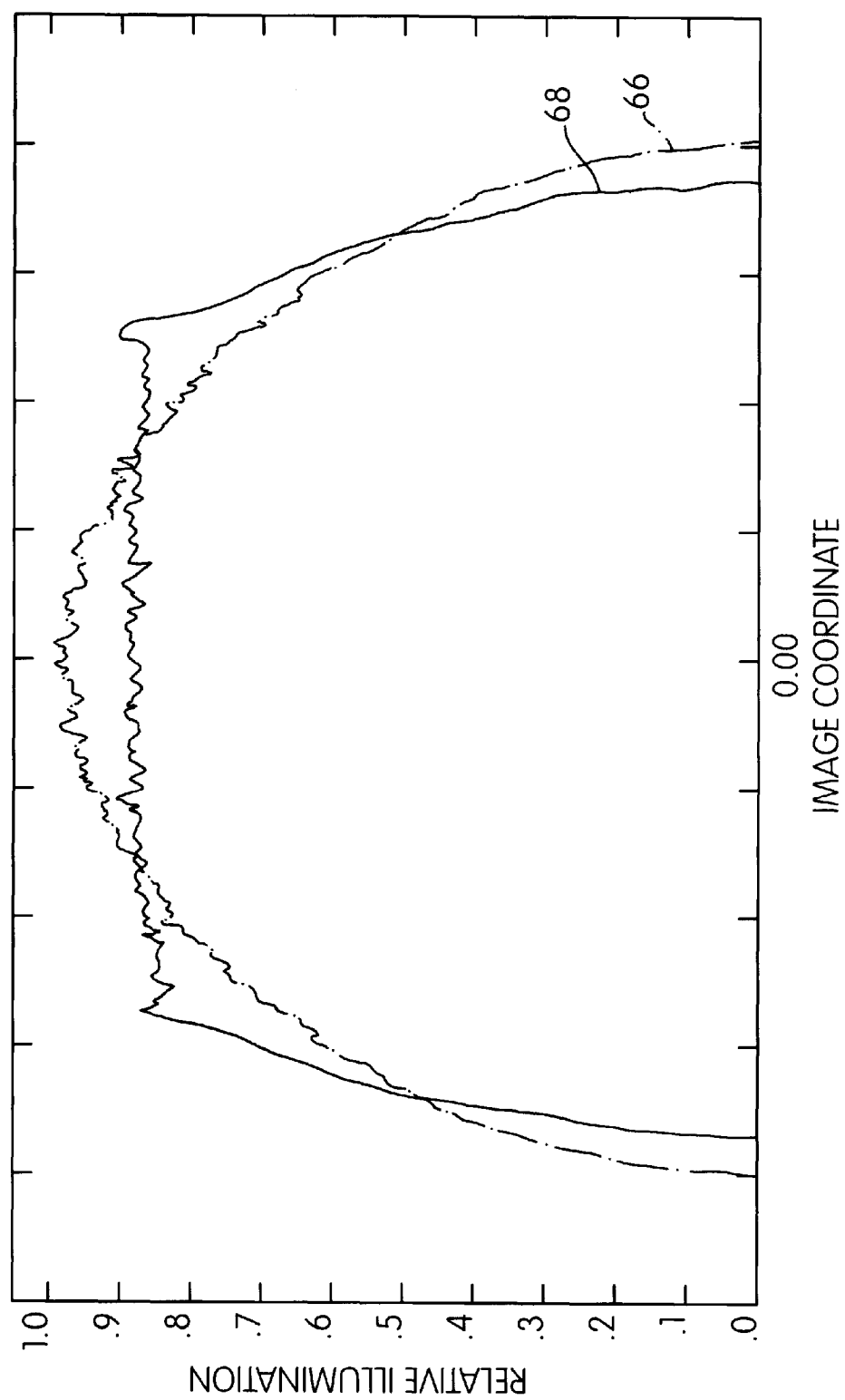
FIG. 7 is a graph illustrating the Gaussian beam intensity profiles of a beam with and without the introduction of spherical aberration.

Accordingly, the planar-concave negative optical element 70 and the planar-convex optical element 72 are each intentionally placed backwards from a normal expected configuration to exaggerate or maxmized spherical aberration introduced in the optical beam. This flattens out the resultant beam profile 68 as shown in FIG. 7. If the optical elements 70 and 72 were each facing the opposite direction, the Gaussian intensity profile would resemble profile 66 in FIG. 7. In lieu of maximizing spherical aberration by planar-convex and planar-concave optical elements, a custom optical element could be provided and mounted in an orientation to maximize spherical aberration.

Imparting the spherical aberration on a stable beam produces a stable, flattened, top-hat-shaped beam profile 68. This enables a significant increase in the speed used for the propagation of the microcracks because an elongated beam can be formed that evenly applies the beam energy across the length of the beam. Flattening out the beam also serves to prevent softening or scorching of the substrate by maintaining the temperature below the critical softening temperature while simultaneously achieving the desired consistent temperature rise in the substrate 4 along the separation line 45.

Figure 8:
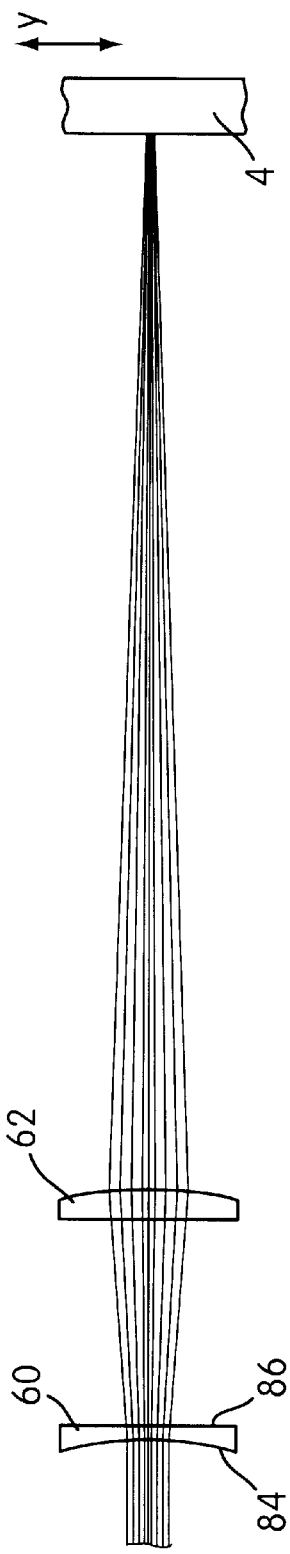
FIG. 8 shows the distribution of the beam in the Y-direction exiting the second set of optical elements and reaching the upper surface of the substrate.
Figure 9:
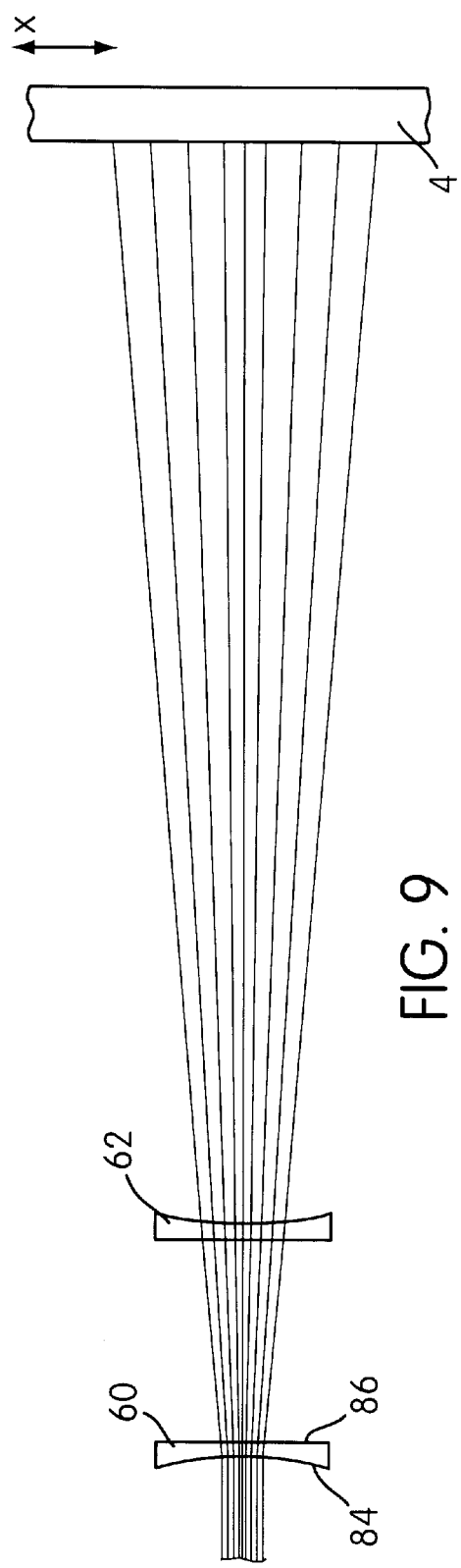
FIG. 9 shows the distribution of the beam in the X-direction exiting the second set of optical elements and reaching the upper surface of the substrate.

If the laser 54 is mounted parallel to the plane of the substrate 4, the beam is bent 90° by a reflective mirror 58. Thereafter, the beam travels through the second set of optics which includes the planar-concave optical element 60 and the cylinder lens 62. The planar-concave optical element 60 is again placed backwards to convention to further maximized spherical aberration. That is, planar-concave optical element 60 imparts more spherical aberration oriented as shown with the incoming beam first contacting its concave surface 84 than it would if the incoming beam first contacted its planar surface 86. The planar-concave optical element 60 may have a −50 mm effective focal length. The cylinder lens 62 is a known optical element that converts a beam which is circular in crossection into an ellipse or other shape. Thus, as shown in FIG. 8, the cylinder lens 62 bends the rays of the beam to converge in a small area along the Y-axis, and may have an effective focal length of 50 mm. As shown in FIG. 9, the cylinder lens 62 passes the rays of the beam therethrough in the X-axis so that the angle of the rays remain unaffected to cover a large area. This produces a scribe beam with its major axis in alignment with the scribe initiation device 24 and the separation line 45, and is shaped similar to that shown in FIG. 5. In effect, the cylinder lens 62 focuses the energy from the beam primaily in one direction only—along the X-axis. The optics are preferably designed and positioned so that the scribe beam has a length along the X-axis of 20–100 mm and a width along the Y-axis of 0.25 mm to 3 mm. A drive 74 is connected to the controller 40 enabling movement of the planar-concave optical element 60 and the cylinder lens 62 in the Z-direction for vertically calibrating or adjusting the focal length of the beam.

Figure 10:
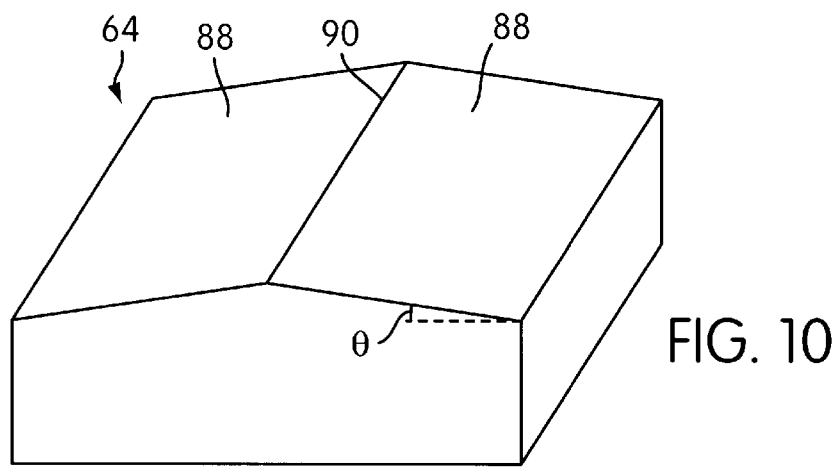
FIG. 10 is an isometric view of the faceted optical device used in forming the break beams.
Figure 11:
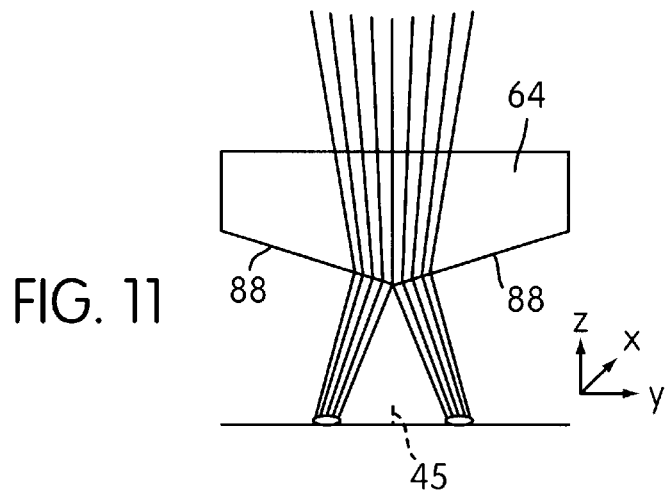
FIG. 11 is an illustration of the beam splitting caused by the faceted lens of FIG. 10.
Figure 12:
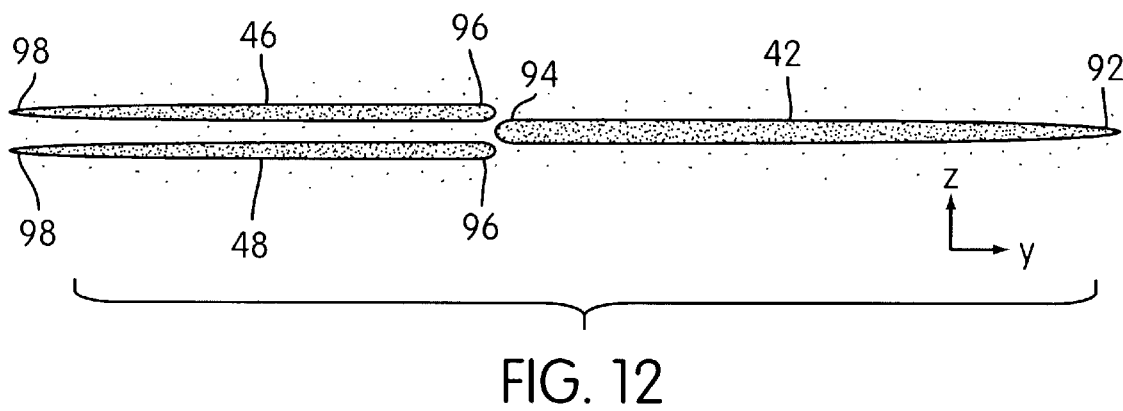
FIG. 12 is an enlarged depiction of a scribe and break beam configuration created by the laser and optics system.

A faceted lens 64, such as shown in FIGS. 10 and 11, is positioned in the rear portion of the beam exiting the cylinder lens 62. Faceted lens 64 is preferably made from the same materials as the other lenses 70, 72, 60, and 62 and is designed to transmit the beam at the wavelength produced by the laser 54. The faceted lens 64 has an upper or lower surface that is defined by angled or sloped surfaces 88 meeting in the center a spine 90. The angled surfaces 88 are preferably angled φ from the horizontal by approximately 0.75°.

The faceted lens 64 is oriented so that its spine 88 is parallel to the X-axis and the separation line 45. The faceted lens 64 may be oriented so that the spine 90 faces upwards or downwards. FIG. 11 illustrates the effect of the faceted lens 64 on the incoming beam. The converging beam exiting from the cylinder lens 62 in the Y-direction contacts the two angled surfaces 88 and is split at the spine 90 with the two portions being refracted to opposing sides of the separation line 45. The breaking beams 46 and 48 are positioned laterally off-axis from the center of the microcrack and the scribe beam 42 to provide tensile forces on opposite sides of the microcrack without annealing the material along the microcrack. The optics are preferably designed and positioned so that each break beam 46 and 48 has a length along the X-axis of 10–30 mm and a width the Y-direction of 1 mm to 5 mm.

The division of the beam by the faceted lens 64 forms scribe and break beams 42, 46, and 48 that have an asymmetric beam profile. Without further manipulation, the width of the scribe beam 42 increases slightly from its forward end 92 to its trailing end 94. The width of the break beams 46 and 48 decreases from their forward end 96 to the trailing end 98. These beam configurations can be advantageous in various circumstances. For example, break beams 46 and 48 in this configuration can help control the onset of tensile forces during the breaks step. If desired, the orientation of these assymeric beams can be reversed by conventional optics if desired for a specific use. For example, rotating the scribe beam 42 so that its leading end is wider than its trailing edge is one way to enable the operator to customize the beam shape to obtain the most desirable thermal gradients for the intended application.

Figure 13:
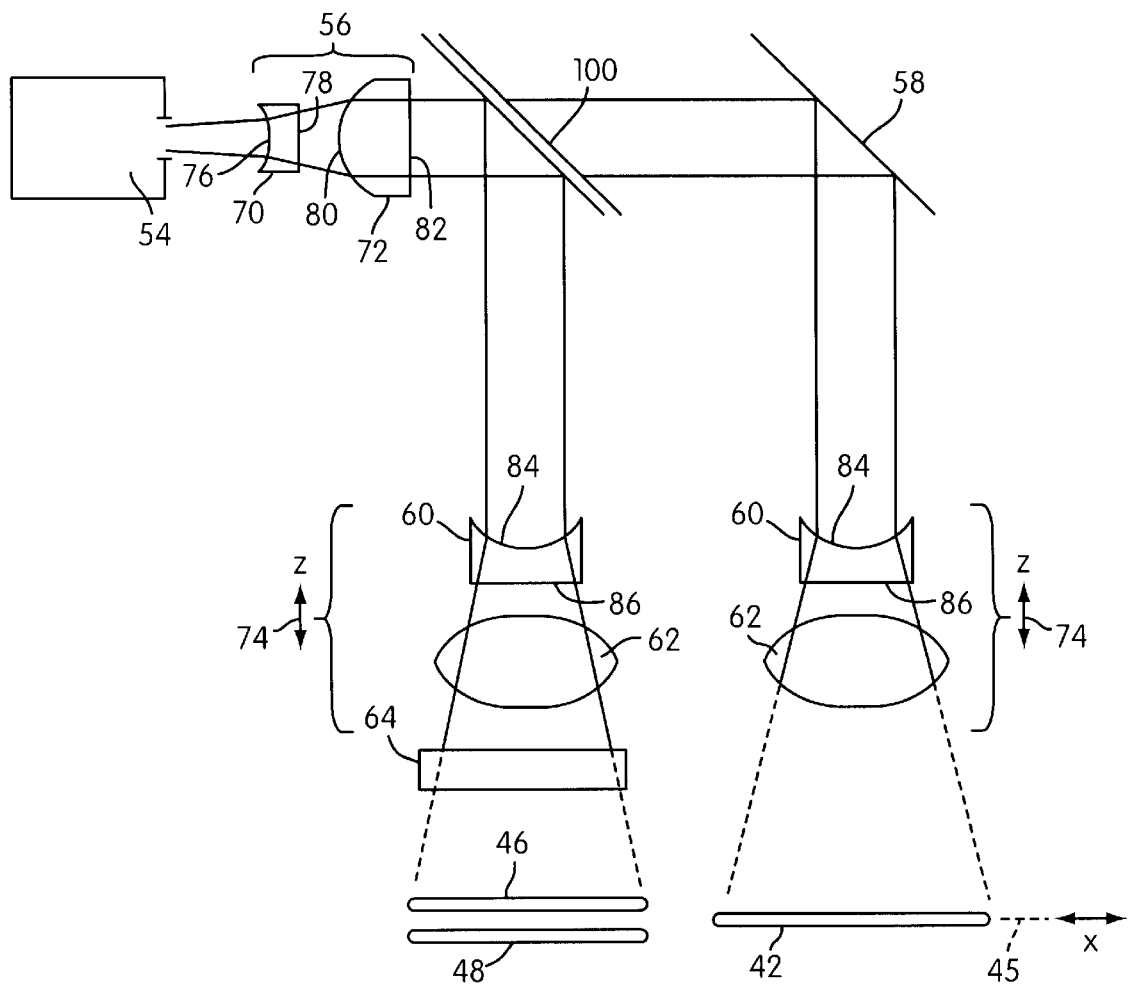
FIG. 13 is a schematic representation of an alternate embodiment of the laser and optical system.

FIG. 13 depicts a laser and optics system primarily differing from that shown in FIG. 6 by providing the ability to more separately control the scribe beam 42 and the break beams 46 and 48 while still maintaining the use of a single laser 54. An additional second set of optics including concave-planar lens 60 and cylinder lens 62 is also provided. The laser 54 and collimator 56 remain identical to that previously described. An angled beam splitter 100 is positioned following the convex-planar lens 72 of the collimator 56. The beam splitter 100 reflects a percentage of the incoming beam and permits the remaining portion to pass therethrough. Preferably, 60–95% of the energy of the beam will be directed to form the break beam 46 and 48, with the remaining 5–40% being directed to form the scribe beam 42. More specifically, approximately 70% of the energy of the beam will be directed to form the break beams 46 and 48, with the remaining energy of the beam being directed to form the scribe beam 42. The portion of the beam transmitted through to beam splitter 100 to form the scribe beam 42 may be reflected off a mirror 58 and through a concave-planar lens 60 and cylinder lens 62 in a manner as previously described. The portion of the beam reflected off of beam splitter 100 to form the break beams 46 and 48 may be passed through a concave-planar lens 60, a cylinder lens 62, and a faceted lens 64 in a manner as previously described. Separate drives 74 may be provided to independently move each concave-planar lens 60 and cylinder lens 62 pair in the Z-direction for calibration purposes of the focal length and to permit separate adjustment of the break and scribe beams. It is noted that while the reflected portion of the beam from the beam splitter 100 is shown as directed to the break beams 46 and 48, the elements can be reconfigured to enable the reflected portion to be used to form the scribe beam 42 is so desired. It is noted that while each beam formed under this process will be symmetrical about at least its minor axis, optics can be provided to alter the shape of the beam to achieve asymmetrical characteristics.

Figure 14:
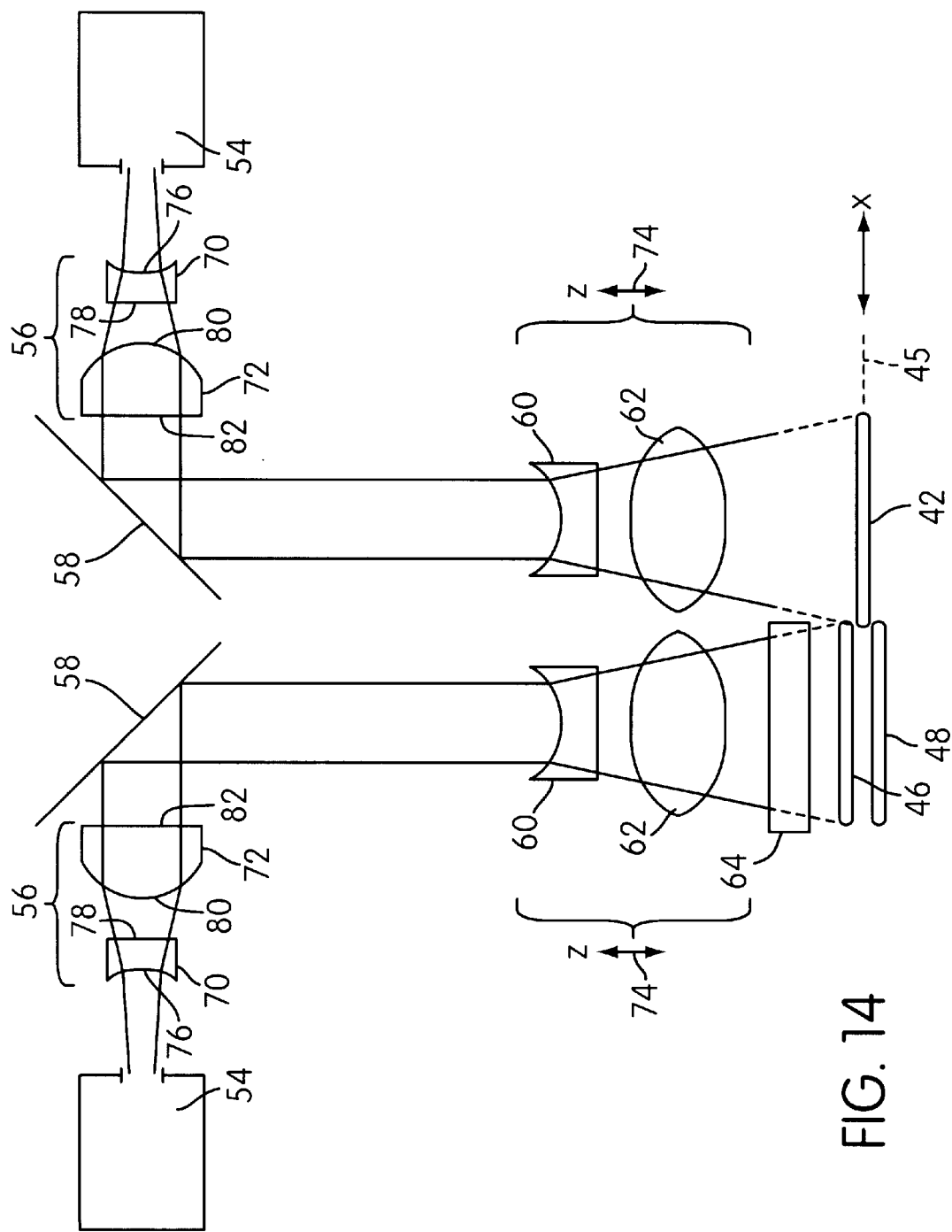
FIG. 14 is a schematic representation of another alternative embodiment of the laser and optical system.

FIG. 14 depicts another laser and optics system that primarily differs from those shown in FIGS. 6 and 13 by providing two distinct laser and optical portions: one for forming the scribe beam 42 and one for forming the break beams 46 and 48. Accordingly, each portion includes its own laser 54, collimator 56, mirror 58, concave-planar lens 60 and cylinder lens 62. The portion for forming the break beams 46 and 48 further includes a faceted lens 64 for dividing and laterally spaing the break beam 46 and 48 from the axis of the separation line 45 in a manner as previously described This also enables independent controls of the scribe and break beams 42 and 46 and 48. The separate lasers 54 may each or both be a lower power laser as it is no longer necessary for a single laser to provide the energy sufficient to form all of the beams used in the separation process. In addition, differing type lasers and/or laser wavelengths may be selected for the scribe and break beams. Further, it is noted that while each beam formed under this process will be symmetrical about at least its minor axis, optics can be provided to alter the shape of the beam to achieve asymmetrical characteristics.

THE QUENCHING SYSTEM

The quenching stream 44 follows the scribe beam 42 and is preferably located at or immediately adjacent to the trailing end 94 of the scribe beam 42. The quenching stream 44 removes energy or "cools" the substrate heated by the scribe beam 42. This rapid temperature differential causes a thermal shock and the microcrack initied by the scribe initiation device 24 will propagate along the separation line 45. The quenching stream 44 is in alignment with the separation line 45 and the central axis of the scribe beam 42 to ensure that the microcrack propagates along a straight line.

Figure 15:
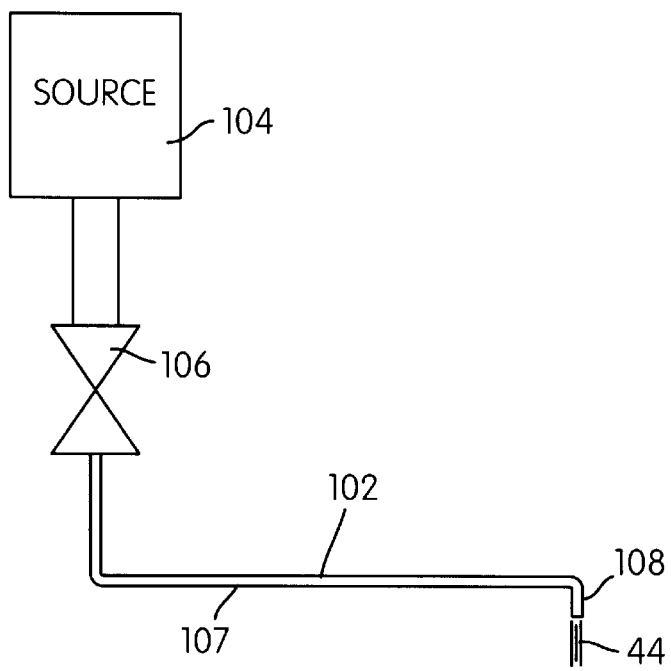
FIG. 15 is a schematic view of the quenching system.

As shown in FIG. 15, the quenching stream 44 is created by fluidly coupling a nozzle 102 to a source 104. A valve 106 electrical connected to the controller 40 and fluidly connected between the nozzle 102 and the source 104 controls the rate of flow of the quenching stream 44. The nozzle 104 includes an elongated horizontal portion 107 and a downward bent vertical tip 108. The nozzle 104 is preferably made of stainless steel and preferably has an inner diameter of approxiately 0.6 mm and an outer diameter of approximately 1.0 mm. Accordingly, this nozzle 102 creates a stream 44 having a very small footprint on the substrate 4.

In a preferred embodiment, the quenching stream 44 is a stream of helium gas. Accordingly, the source 104 contains pressurized helium gas. Helium gas is desirable because it has a high heat capacity and is thus efficient at removing the heat from the substrate 4. Other types of pressurized gas such as nitrogen, $CO_2$ and argon may also be used. Pressurized air may also be used. As an alternative to using presurized gas only, a mixture of pressurized gas and water may be supplied to a valve from separate sources and discharged together through the nozzle 102.

This arrangement of the quenching system provides many advantages. First, because it includes a very small footprint on the substrate 4, it more accurately controls the straightness and direction of the microcrack than a stream with a large footprint because it minimizes the possibility that the crack will veer from its central axis. Placing the quenching stream 44 directly behind the heat affected zone enhances the ability to achieve full single pass separation by causing a "V" shaped thermal gradient near the quench zone. This placement also aids in the control of the direction of the microcrack because of the directional nature of the "V" shaped thermal gradient. This arrangement also increases the efficiency of the microcracking process by eliminating any effective time period that would act to permit the preheated zone to cool, thereby maximizing the temperature differential which causes the thermal rupture.

The depth of the microcrack is determined by the temperature, velocity and content of the quenching fluid, the magnitude and distribution of the scribe beam 42, and the relative speed between the substrate 4 and the splitting device 20. In a preferred arrangement, the microcrack only extends downwardly 20–50 $\mu$m from the upper surface of the substrate 4. If the substrate 4 has been laser scribe initiated, the microcrack will form upwardly from the void in the substrate and split the top surface along the separation line 45 upon the quenching stream 44 reaching the extended heat affected zone.

MECHANICAL FORCE APPLICATOR

If desired, a mechanical force applicator can be used to apply a bending moment to the substrate 4 about an axis defined by the separation line 45. This creates an induced mechanical strain field and facilitates the breaking process. As the substrate should preferably separate into distinct pieces upon the completion of a single pass of the splitting device, use of a mechanical force applicator can help achieve single pass separation. A mechanical force applicator may be preferred if the substrate 4 to be separated is large.

One type of mechanical force applicator is shown in FIG. 3. The device 28 preferably includes a rotatable wheel 110 laterally offset from the separation line 45 which is mounted for rotation about an axis perpendicular to the cut line 45. The wheel 110 is preferably made from or covered by a soft material, such as nylon, so that it can apply a force without scratching the substrate 4. A drive 111 for moving the wheel 110 in the vertical direction is coupled to the controller 40 so the mechanical force may be selectively applied. Z-drive 111 can be any motor or actuator capable of moving the wheel 110 into and out of engagement with the upper surface of the substrate 4. If desired, the wheel 10 may be spring biased. This is desirable when performing end-cuts because the wheel 110 of the mechanical force applicator can apply a force at the free end which places a bending moment on the separation line. Additionally, another mechanical force applicator, such as the wheel 110 and Z-drive 111, may be placed on the opposite side of the separation line 45 to further increase the bending moment.

Figure 16:
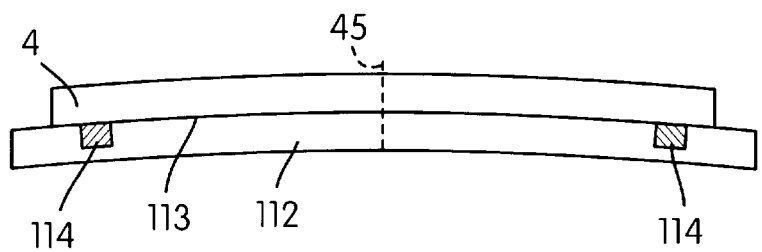
FIG. 16 is an end view of the chuck for holding the substrate.
Figure 17:
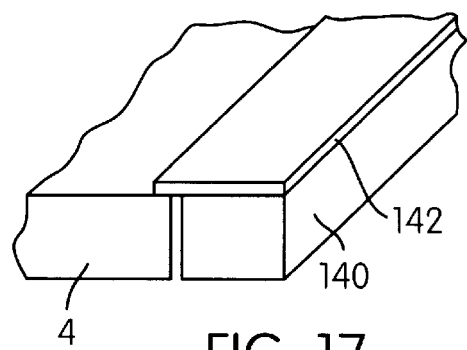
FIG. 17 is a side view of the front end of the substrate and the beam blocker.

Another arrangement for applying a mechanical force usable with or in lieu of the wheel 110 described above can be part of the fixture 112 for holding the substrate 4. As shown in FIG. 16, the fixture 112 has an upper surface 113 upon which the substrate 4 is mounted. The upper surface 113 is curved in the Y-direction so that there is a small rise in the elevations at the locations where the substrate 4 will be separated. Spaced vacuum holding devices 114 are used to hold the bottom of the substrate 4 to the fixture 112. When the forces applied by the vacuum holding devices 114 are applied, the bottom of the substrate 4 will conform to the top surface 113 of the fixture 112. Accordingly, that bends the substrate 4 to provide a bending moment at the separation line 45 to facilitate separation.

OPERATION

A substrate 4 is placed on a fixture 112 on the table 10. The thickness of the substrate 4 is preferably in the range between 50 μm and 30 mm. However, most of the substrates separated according to this procedure will likely have a thickness in the range between 1–3 mm. If desired, the upper surface 113 of the fixture 112 is curved at one or more predetermined locations and the substrate 4 is held to fixture 112 by vacuum holding devices 114. This induces stresses along separation lines.

The substrate 4 is initially scribed, either by a mechanical device or a laser, to initiate a microcrack in the substrate 4. Preferably, the microcrack only extends a small distance into the substrate 4 from the edge and from the top surface. If a laser scribe initiation device 24 is used, the laser is pulsed to create a void in the substrate 4. To accomplish this, the splitting device 20 which contains the scribe initiation device, is moved relative to the table 10 in the direction of the separation line 45. If the substrate 4 already includes microcracks in its edges, one of these microcracks could be used as an initial microcrack.

At least one scribe beam is applied onto the substrate at the microcrack in the direction that the substrate will be cracked and/or separated. The scribe beam moves relative to the substrate along the separation line to heat the material in a heat affected zone. The heat applied to the substrate 4 and the relative speed between the substrate 4 and the splitting device 20 preferably prevents the temperature of the substrate 4 from reaching its critical softening point or melting point in the heat affected zone.

A quenching device applies a coolant stream onto the substrate at or adjacent to the trailing end of the scribe beam. The temperature differential between the coolant stream and the preheated heat affected zone on the substrate imparts a thermal shock to the substrate 4 in that region causing the initiated microcrack to propagate along the separation line 45. The depth of the microcrack is preferable relatively small as compared to the thickness of the substrate 4. For example, the depth of the microcrack is preferably less than 10% of the thickness of the substrate 4.

Two breaking laser beams 46 and 48, each laterally displaced from the microcrack on opposite sides, immediately follow the coolant stream. The heat applied to the substrate 4 by the breaking beams 46 and 48, the location of the breaking beams 46 and 48, and the relative speed between the substrate 4 and the splitting device 20 create controlled tensile forces on both sides of the microcrack. These forces are primaily due to the effects of thermal expansion. These forces exceed the molecular forces holding the substrate together at the base of the microcrack. This causes the crack to extend downward to the bottom surface of the substrate 4 completely dividing the substrate along the path of the microcrack. The energy applied to the heat affected zone of the substrate by the breaking beams does not raise the temperature of the substrate above its annealing point or melting point in the heat affected zone.

Positioning the breaking beams 46 and 48 in a location laterally offset from the microcrack and the separation line 45 avoids the direct reheating of the material along the separation line 45. This arrangement is desirable because directly reheating the material along the crack could inhibit separation, cause the substrate to crack uncontrollably along weak areas near the edges, and have a negative effect on the ability to control the forces applied to the substrate 4.

If desired, a vertically movable mechanical force applicator, such as a rotatable wheel 110, can be lowered to apply a force laterally offset from the separation line 45 to place a bending moment on the separation line to facilitate separation.

Figure 2:
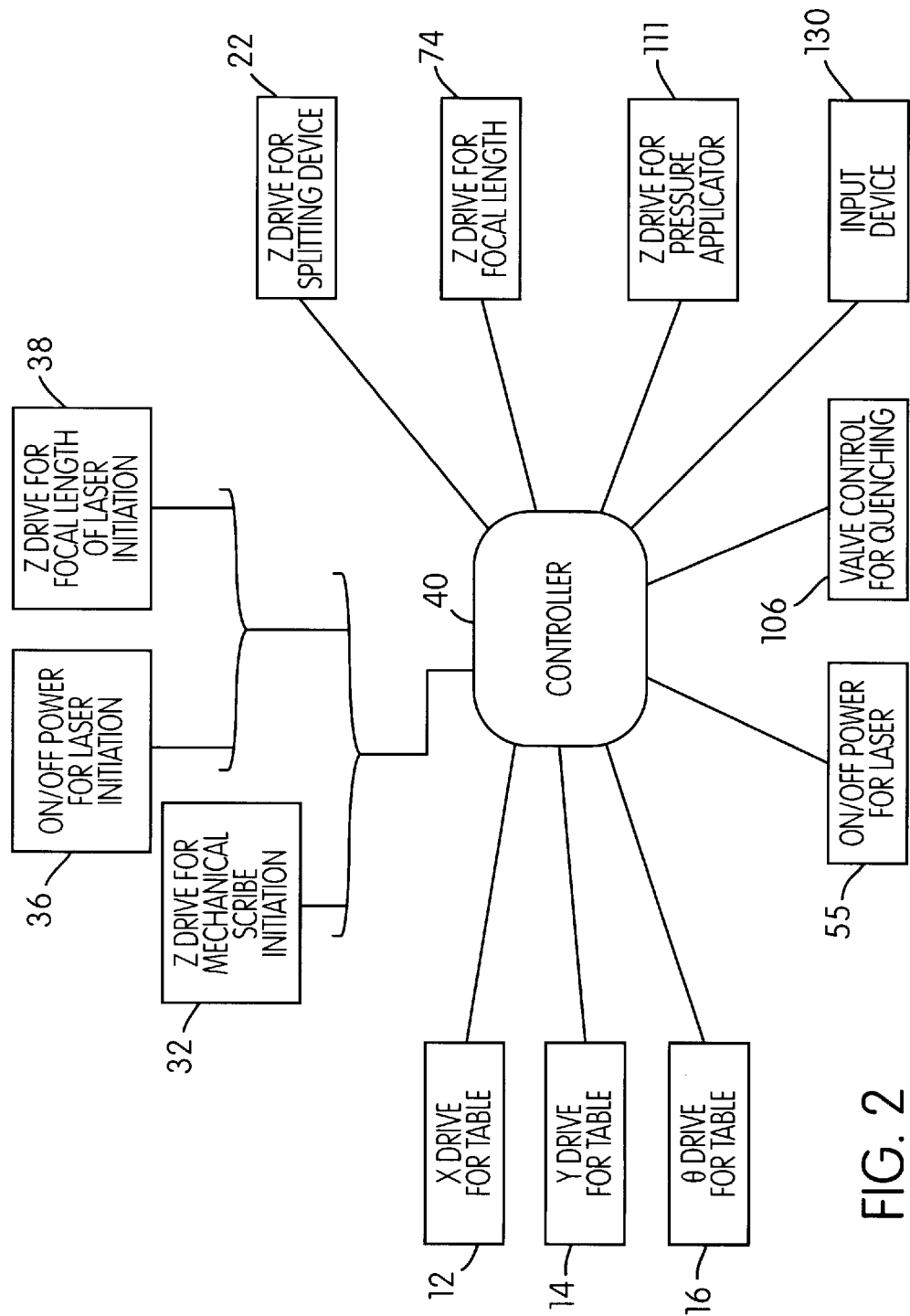
FIG. 2 is a schematic representation of the control system.

As shown in FIG. 2, controller 40, which can be a computer or other electrical signal processing device, is coupled to an interface/input device 130 and various feedback devices. This enables a user to set and modify the settings of any of the controlled devices to optimize the separation process.

Once the substrate 4 has been separated, the edges along the separation line are inherently smooth and defect free and no post-processing operations such as cleaning, edge seaming and polishing are necessary. The separation process is extremely efficient. The substrate can be laser scribed and/or fully separated in a single step process. This method substantially increases existing separation speeds through the implementation of an extended, uniform heat affected zone in combination with immediate quenching to form a "V" shaped thermal gradient. By coupling thermal tensile forces with a formed microcrack, single pass separation of non-metallic substrates can be accomplished. For example, glass substrates having thicknesses greater than 1 mm may be separated in a single pass at a rate between 380–600 mm/sec. The reliability and reproducibility of this process is further enhanced by using a laser in its $TEM_{00}$ mode. By lengthening the laser beam and smoothing out the spatial profile, the scribing process can reach speeds of up 1000 mm/sec, if scribing alone is desired.

Additionally, the process maximizes that ability to cut the substrate 4 straight from edge to edge, and minimizes end effects that may cause premature cracking in the back edge of the substrate 4 before the microcrack reaches the back edge. Besides using the elongated beam shapes and laser scribe initiation techniques to achieve these results, a beam blocker 140 may be placed at the far end of the substrate 4 perpendicular to the separation line 45 to block the exit surface. The beam blocker 140 preferably only covers the end 0.5–2 mm of the separation line 45. The beam blocker 140 may be include small metallic strip 142 or may be a coating directly applied to the substrate 4.

To assist in total separation, a second puled laser, not shown, may be added behind or adjacent to the break beams 46, 48 to assist in thermal break and further ensure that the substrate separates entirely.

Additionally, while the beams 42, 46, and 48 are depicted in certain configurations, other variations are possible. For example, the break beams 46 and 48 need not have their major axes parallel to the separation line and can be angularly displaced from the separation line by using various conventional optical techniques. Further, if desired, the distance the distance between the scribe and break beams may be varied based upon the characteristics of the substrate and other parameters. The scribe beam 42 and/or the break beams 46, 48 also need not be single uninterrupted beams and may be comprised of a number of smaller beams. This, in combination with standard control and optic arrangements provides the ability to independently power and/or rotate the beams, facilitates scribing and separation of non-linear separation lines. Also, in lieu of the optics system disclosed above, gradient index optics or shaped mirrors may be used to customize any beam to achieve a desired beam profile.

Figure 18:
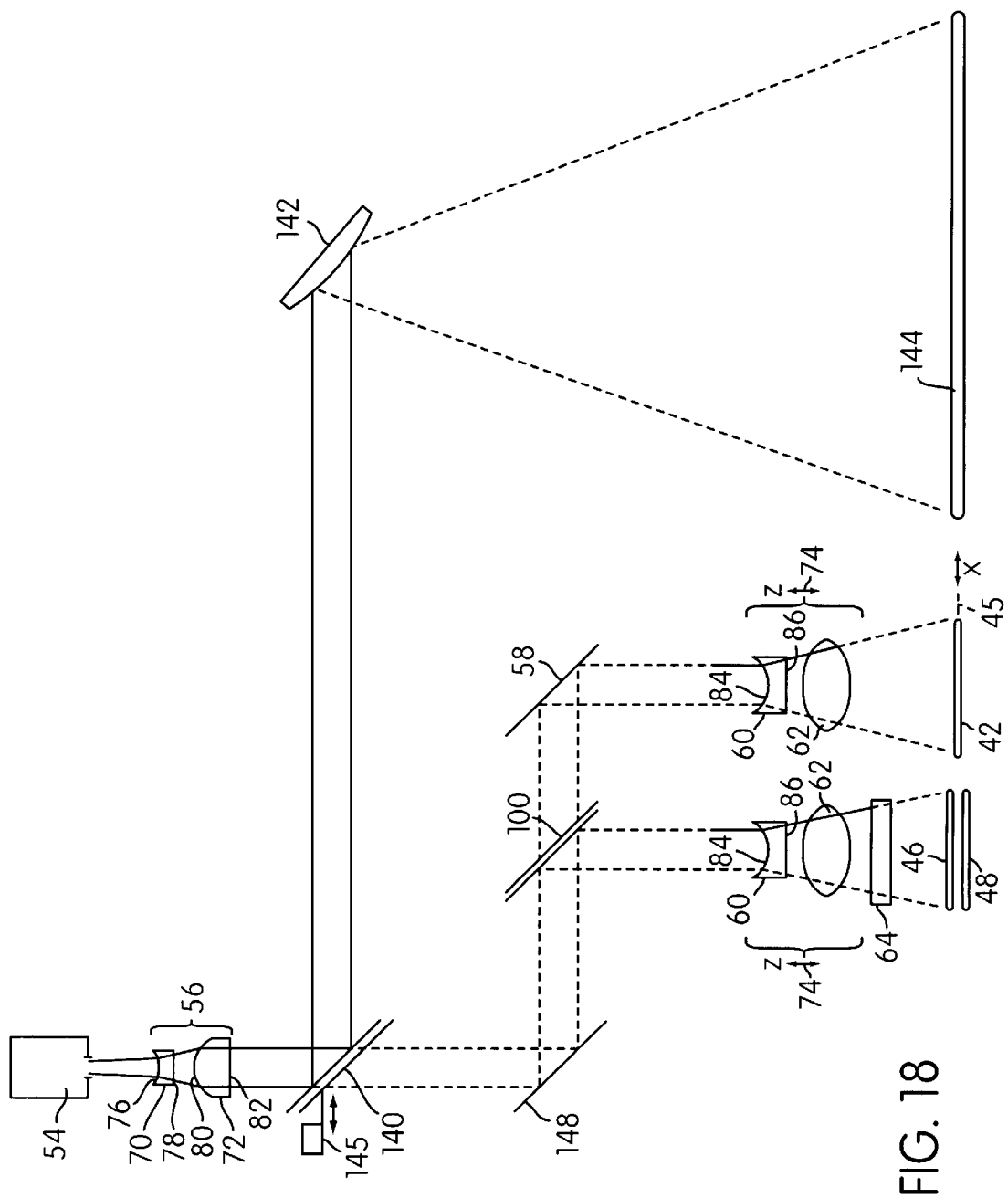
FIG. 18 is a schematic representation of the laser and optical system with a system for providing an extended preheat zone.
Figure 20:
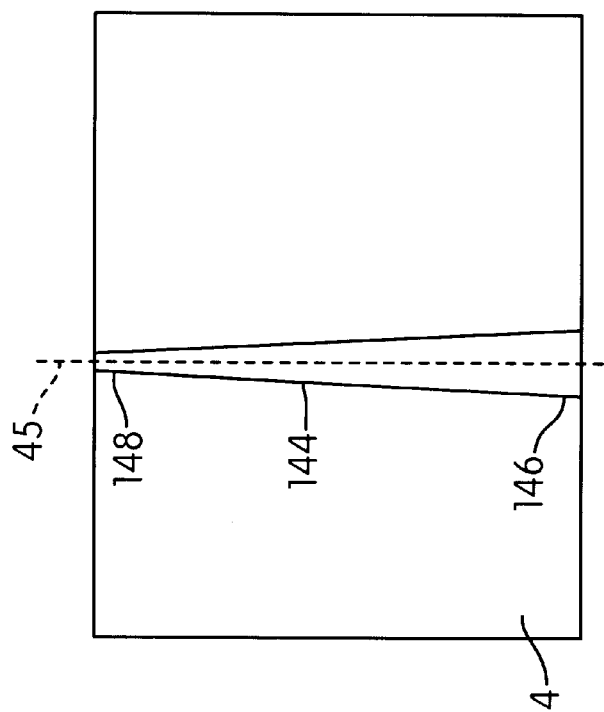
FIG. 20 is a top plan view showing the shape of the extended pre-heat beam with respect to the substrate in more detail.
Figure 19:
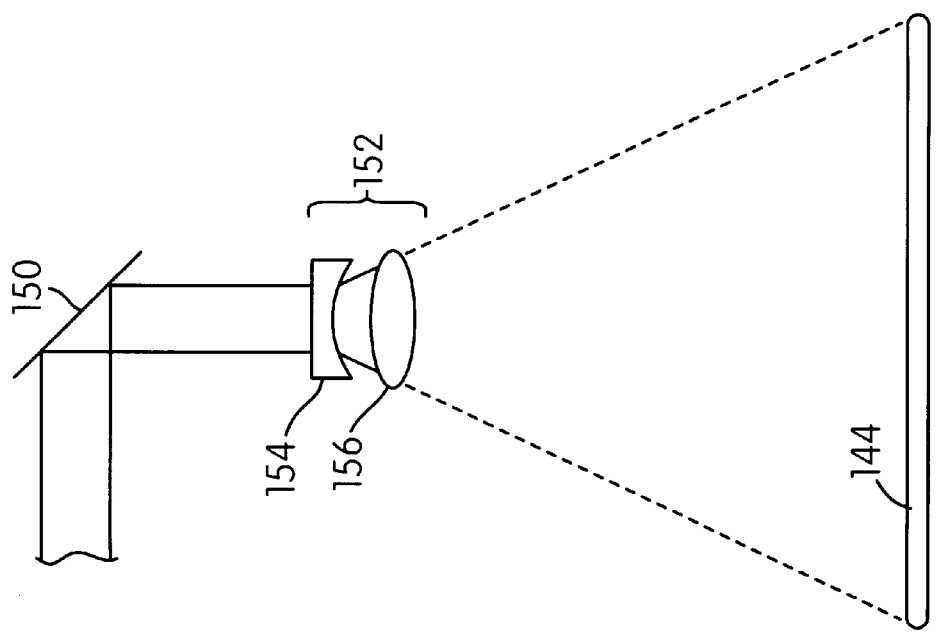
FIG. 19 is a schematic representation of an alternative arrangement for providing an extended preheat zone.

As shown in FIGS. 18–20, the system for separating the substrates 2 may also be equipped with an arrangement for producing an extended pre-heating zone. Utilizing an extended preheating zone increases the temperature of the substrate 4 in the area immediately around the separation line 45 just prior to applying the scribe and break beams 42, 46, 48. This reduces the initial thermal shock to the substrate and minimizes uncontrolled cracking. Further, by preheating this zone, faster speeds for moving the scribe and break beams can be obtained.

As shown in FIG. 18, the extended preheat zone can be created by placing a movable mirror 140 in the path of the beam emitted from laser 54. When the movable mirror 140 is in a first or preheat position, as shown in FIG. 18, the beam emitted from laser 54 is reflected toward beam expanding and shaping elements to create an elongated narrow preheat beam 144 that impinges on the substrate 4. When the desired preheat zone on the substrate 4 has been preheated to a desired temperature, the movable mirror 146 may be moved out of the way of the path of the beam emitted by laser 54 into a second or substrate separation position, and the laser 54 will be directed to produce the scribe and break beams 42, 46, 48 as previously described. The movable mirror 140 may be moved between the first and second positions by any movable driving system 145, such as a motor and a movable stage or flipper.

In one arrangement, as shown in FIG. 18, the preheat beam can be expanded to form the preheat zone by a curved mirror 142, such as a mirror having a cylindrical reflective surface. In another arrangement, as shown in FIG. 19, a mirror 150 with a substantially straight reflective surface can be used in conjunction with optics 152 to provide the desired beam shape 144. One optical arrangement can include a planar-concave optical element 154 and a cylinder lens 156. However, other optical arrangement can be used to provide the desired preheat beam impingement footprint.

As shown in FIG. 20, the preheat beam preferably preheats the substrate 4 on the separation line 45 across substantially the entire length of the cut. Thus, the beam shape profile used will depend the length of the cut on the substrate and will typically extend in length between 100–720 mm. The width of the preheat beam 144 is extremely narrow in proportion to its length and is prefably less than 10 mm. More preferably, the width of the preheat beam 144 is less than 4 mm. Having a narrow preheat zone is beneficial over preheating the entire substrate because it sets up a temperature gradient in the transverse direction which assists in the propagation of the microcrack and the total separation of the substrate 4.

Further, as shown in exaggeration in FIG. 20, the beam 144 is preferably shaped to taper inward from its wider end 146 adjacent the being of the cut to its end adjacent the other end 148 of the cut. This narrowing is preferred to maximize the consistency of the thermal boundary conditions of the substrate 4 along the separation line 45 as the scribe and break beams 42, 46, 48 advance along the separation line 45. Since the beam is more narrow towards its far end, the energy density of the beam and the temperature of the substrate 4 will also be higher at the far end. This will compensate for the thermal dissipation that occurs during the time it takes the scribe and break beams 42, 46, 48 to travel from one end of the substrate 4 to the other end, so that the boundary conditions along the separation line 45 will be as consistent as possible. The ideal degree of taper for the preheat beam will depend upon the thermal properties of the substrate 4, the speed of the scribe and break beams 42, 46, 48, and the length of the cut. The footprint of preheat beam 144 can be obtained by the position, orientation, and shape of the lenses and/or the mirrors.

In operation, the movable mirror 140 is placed in its preheat position before engaging the motion system to preheat the region to be cut on the substrate 4. This raises the temperature of the substrate 4 in the region from room temperature, which is about 25° C. to between 100° C. and 250° C. depending on the substrate type, for example glass, and the application. Immediately after the separation zone on the substrate 4 is preheated, the mirror 140 is moved to its second position so that the beam path goes through its primary beam path and the separation by the scribe and break beams can commence. Preferably, the scribe and break beams are moved to contact the substrate 4 as soon as possible after the preheating to minimize the radiant and conductive cooling effects.

Alternatively, in lieu of a single elongated preheat beam, the extended preheat zone can be created by using a mirror that provides a spot that is narrow in the direction transverse to the separation line 45 and has a length less than the length of the separation line 45. A mirror can be attached to a motor, not shown, that moves the mirror to scan the beam along the separation line 45. This would also achieve a preheated narrow elongated zone extending substantially the entire length of the separation line 45.

Further, while the drawings illustrate the preheat beam 144 emanating from the laser system for producing the scribe and break beams shown in FIG. 13, the preheat beam 144 can emanate from a laser used in any of the depicted embodiments to form the scribe and break beams. Alternatively, a separate laser, not shown, may be provided with the desired optics, as described above, to create the preheat beam.

Although several preferred embodiments of this invention have been described in detail herein with reference to the accompanying drawings, it is to be understood that the invention is not limited to these illustrative embodiments, and that the various changes and modifications may be made herein by one skilled in the art without departing from the true spirit and full scope of the invention.

What is claimed is:

1. A method for separating a non-metallic substrate having an upper surface and a lower surface, the method comprising:

forming a crack in the substrate between the upper surface and the lower surface that does not extend vertically to either the upper surface or the lower surface;

propagating the crack, including directing a scribe beam of coherent radiation onto the substrate and applying a stream of coolant onto the substrate; and separating the substrate.

2. The method of claim 1, further comprising the step of simultaneously moving the scribe beam and the coolant stream relative to the substrate.

3. The method of claim 1, wherein said forming a crack step includes pulsing a laser to apply a beam to the substrate such that the beam has a focal point located between the upper and lower surfaces of the substrate, said method further comprising the step of simultaneously moving the beam from the pulsed laser, the scribe beam and the coolant stream relative to the substrate.

4. The method of claim 1, further comprising the step of directing a plurality of break beams of coherent radiation onto the substrate.

5. The method of claim 4, wherein the break beams directing step includes directing a plurality of break beams of coherent radiation onto the substrate to impinge behind and laterally offset from an impingement spot of the scribe beam.

6. A method for separating a non-metallic substrate by propagating a microcrack, the substrate having an upper surface and a lower surface, the method comprising:

directing a pulsed laser towards the substrate so that the focal point of the laser is between the upper and lower surfaces of the substrate;

pulsing the laser to form a microcrack;

directing an incident beam of coherent radiation onto the substrate to impinge at a spot positioned at least behind the focal point of the pulsed laser; and applying a stream of coolant onto the substrate at a location behind at least a portion of the spot caused by the incident beam.

7. The method of claim 6, wherein said directing step includes directing a pulsed laser towards the substrate so that the focal point of the laser is 5%–50% of the thickness of the substrate from the upper surface of the substrate.

8. The method of claim 6, wherein said incident beam of coherent radiation is a first beam of coherent radiation, said method further comprising the step of directing a second incident beam of coherent radiation onto the substrate to impinge at a spot positioned at least partially behind and laterally offset from the impingement spot of the first beam.

9. The method of claim 8, further comprising the step of directing a third incident beam of coherent radiation onto the substrate to impinge at a spot positioned at least partially behind and laterally offset from the impingement spot of the first beam.

10. A The method of claim 6, wherein said substrate has a first end and a second end, said substrate to be separated along a line between the first and second ends, said method comprising applying the pulsed laser at the first end and the second end and not applying the pulsed laser for a distance along the line between the first and second ends.

11. The method of claim 6, wherein said substrate has a first end and a second end, said substrate to be separated along a line between the first and second ends, said method comprising constantly applying the pulsed laser along the line from the first end to the second end.

12. The method of claim 6, further comprising the step varying the polarization of the pulsed laser.

13. The method of claim 6, further comprising the step varying the pulse width of the pulsed laser.

14. The method of claim 6, further comprising the step varying the mode of the pulsed laser.

15. The method of claim 6, wherein said method for separating a substrate includes separating a glass sheet.

16. An apparatus for separating a non-metallic substrate by propagating a microcrack, the substrate having an upper surface and a lower surface, the apparatus comprising:

a first laser, said first laser being a pulsed laser to emit a pulsed first beam to be directed at the substrate, wherein said pulsed first beam has a focal point located between the upper and lower surfaces of the substrate; and an incident second beam of coherent radiation, said second beam positioned to impinge on the substrate at a location at least partially behind the pulsed first beam.

17. An apparatus for separating a non-metallic substrate by propagating a microcrack, the substrate having an upper surface and a lower surface, the apparatus comprising:

a first laser, said first laser being a pulsed laser to emit a pulsed first beam to be directed at the substrate;

an incident second beam of coherent radiation, said second beam positioned to impinge on the substrate at a location at least partially behind the pulsed first beam; and a quenching device, said quenching device imparting coolant directed at the substrate at a position behind at least a portion of the impingement location of the second beam.

18. The apparatus of claim 17, further comprising third and fourth beams of coherent radiation, said third and fourth beams positioned behind at least a portion of the impingement location of the second beam.

19. The apparatus of claim 18, further comprising a second laser, said second laser emitting an initial beam that is split to produce said second, third, and fourth beams.

20. The apparatus of claim 18, further comprising a second laser, said second laser emitting producing said second beam, and a third laser, said third laser emitting an initial beam that is split to produce said third and fourth beams.

21. The apparatus of claim 18, wherein said substrate is divided along a separation line, said third and fourth beams positioned laterally offset from the separation line, and on opposite sides thereof.

22. An apparatus for separating a non-metallic substrate by propagating a microcrack, the substrate having an upper surface and a lower surface, the apparatus comprising:

a pulsed laser, said pulsed laser emitting a pulsed beam, at least one optical element, said at least one optical element directing the focal point of the beam emitted by the pulsed laser to lie between the upper and lower surfaces of the substrate at a first spot;

a second laser capable of emitting an incident beam of coherent radiation positioned to impinge on the substrate at a second spot positioned at least partially behind the first spot; and a quenching device, the quenching device projecting a steam of coolant onto the substrate at a location behind the first spot and behind at least a portion of the second spot.

23. The apparatus of claim 22, further comprising means for simultaneously moving said first and second spots and the location of the projection of the coolant relative to the substrate.

24. The apparatus of claim 22, wherein said at least one optical element is vertically adjustable relative to said pulsed laser for adjusting the location focal point of the pulsed first beam between the upper and lower surfaces of the substrate.

* * * * *